United States Patent [19]

Kinashi et al.

[11] Patent Number: 4,568,629
[45] Date of Patent: Feb. 4, 1986

[54] DRY PLANOGRAPHIC PLATE WITH SILICON RUBBER LAYER AND ORGANIC POLYMER OVERLAYER

[75] Inventors: Takao Kinashi, Otsu; Mitsuru Suezawa, Shiga; Masaya Asano, Otsu, all of Japan

[73] Assignee: Toray Industries, Incorporated, Tokyo, Japan

[21] Appl. No.: 553,765

[22] Filed: Nov. 21, 1983

[30] Foreign Application Priority Data

Nov. 24, 1982 [JP] Japan .................. 57-204533

[51] Int. Cl.[4] .............................. G03C 1/76
[52] U.S. Cl. ................... 430/272; 430/273; 430/300; 430/302; 101/457
[58] Field of Search ............... 430/272, 273, 302, 300, 430/960, 961; 101/457

[56] References Cited

U.S. PATENT DOCUMENTS

| | | |
|---|---|---|
| 3,677,178 | 6/1972 | Gipe . |
| 3,728,123 | 4/1973 | Gipe ................................ 430/272 |
| 3,865,588 | 2/1975 | Ohto et al. . |
| 3,886,865 | 6/1975 | Ohto et al. ........................ 430/302 |
| 3,894,873 | 7/1975 | Kobayashi et al. . |
| 3,909,265 | 9/1975 | Miyano et al. . |
| 3,948,827 | 4/1976 | Noshiro et al. .................... 430/302 |
| 3,949,142 | 4/1976 | Doggett . |
| 3,953,212 | 4/1976 | Miyano et al. . |
| 4,019,904 | 4/1977 | Noshiro et al. .................... 430/302 |
| 4,086,093 | 4/1978 | Ezumi et al. ...................... 430/302 |
| 4,100,135 | 7/1978 | Chu et al. .......................... 430/302 |
| 4,164,422 | 8/1979 | Okai et al. ......................... 430/272 |
| 4,271,255 | 6/1981 | Cho et al. .......................... 430/302 |
| 4,342,820 | 8/1982 | Kinashi et al. .................... 430/272 |
| 4,347,303 | 8/1982 | Asano et al. ...................... 430/272 |
| 4,358,522 | 11/1982 | Fujita et al. . |
| 4,430,379 | 2/1984 | Hayakawa et al. ............... 430/302 |

Primary Examiner—Jack P. Brammer
Attorney, Agent, or Firm—Scully, Scott, Murphy & Presser

[57] ABSTRACT

A dry planographic plate has an image area and a non-image area in the shape of an image. The non-image area is constituted by a silicone rubber layer. The surface of the plate is coated with a thin film containing an organic polymer.

7 Claims, 2 Drawing Figures

DRY PLANOGRAPHIC PLATE WITH SILICON RUBBER LAYER AND ORGANIC POLYMER OVERLAYER

BACKGROUND OF THE INVENTION

The present invention relates to a dry planographic plate having a non-image area constituted by a silicone rubber layer, and more particularly, to a dry planographic plate improved to be able to maintain an excellent ink receptivity by coating the surface thereof with a layer containing an organic polymer. The invention also pertains to a method of preparing the above dry planographic plate, and an organic polymer solution for coating the plate surface with a layer containing an organic polymer, as well as a processing apparatus for coating the plate surface with a layer containing an organic polymer.

As a dry planographic plate having a non-image area constituted by a silicone rubber layer backed with a substrate, for example, the following various plates have been proposed: (A) a plate formed by providing an image-forming substance layer (photosensitive layer), on a substrate and further providing a silicone rubber layer on the image-forming substance layer (i.e., a plate having silicone rubber as the upper layer) as shown in the specifications of U.S. Pat. Nos. 3,894,873 and 4,358,522, for example; (B) a plate formed by providing an image-forming substance layer (photosensitive layer) on a silicone rubber layer backed with a substrate (i.e., a plate having a silicone rubber as the lower layer), as shown in the specifications of U.S. Pat. Nos. 3,677,178, 3,949,142 and 3,909,265, for example; and (C) a plate constituted by only a silicone rubber layer backed with a substrate, the silicone rubber layer itself having photosensitivity so as to form an image (i.e., a plate having only a silicone rubber layer), as shown in the specifications of U.S. Pat. Nos. 3,953,212 and 3,865,588, for example.

These unprocessed dry planographic plates are processed by a known method to obtain dry planographic plates each having a non-image area (ink-repelling area) constituted by the silicone rubber layer. However, in the image area (ink-receiving area) of each of these plates is present a silicone compound which has supposedly oozed out from the adjacent silicone rubber layer, or moved from the non-image area in developing the plate.

Moreover, this silicone compound is apt to concentrate on the surface of the image area. If the plate is stored for a long period of time, the silicone compound concentrating on the image area surface further increases in amount.

Therefore, when printing is effected using a dry planographic plate having a non-image area constituted by a silicone rubber layer, particularly when a dry planographic plate which has been stored for a long period of time after processing is employed, the silicone compound present in its image area (ink-receiving area) impairs the ink receptivity, making it impossible to obtain a good print, disadvantageously.

SUMMARY OF THE INVENTION

Accordingly, it is an object of the invention to provide a dry planographic plate capable of maintaining an excellent ink receptivity.

It is another object of the invention to provide a method of preparing a dry planographic plate capable of maintaining an excellent ink receptivity.

It is still another object of the invention to provide a coating solution for forming a coating on a dry planographic plate in order to maintain the same excellent in ink receptivity.

It is a further object of the invention to provide a processing apparatus for forming a coating on a dry planographic plate in order to maintain the same excellent in ink receptivity.

The invention resides in a dry planographic plate having an image area and a non-image area in the shape of an image, the non-image area being constituted by a silicone rubber layer, characterized in that the surface of the plate is coated with a thin film containing an organic polymer.

Moreover, the invention resides in a method of preparing a dry planographic plate, the method comprising the steps of: exposing, through an image film, an unprocessed dry planographic plate constituted by a substrate on which at least a silicone rubber layer is provided; effecting development thereby to form a non-image area of the silicone rubber layer following the shape of the image on the image film; and coating the surface of the plate with a solution or dispersion of an organic polymer thereby to form a thin film containing the organic polymer.

Further, the invention resides in a processing solution for coating the surface of a dry planographic plate constituted by a substrate on which at least a silicone rubber layer is provided, the plate having imagewise a non-image area which is formed by the silicone rubber layer, characterized by comprising a solution or dispersion of an organic polymer.

Furthermore, the invention resides in an apparatus for processing a dry planographic plate, the apparatus for processing a dry planographic plate, the apparatus comprising a processing means for applying a solution or dispersion of an organic polymer to the surface of a dry planographic plate constituted by a substrate on which at least a silicone rubber layer is provided, the plate having imagewise a non-image area which is formed by the silicone rubber layer.

Figure 1:
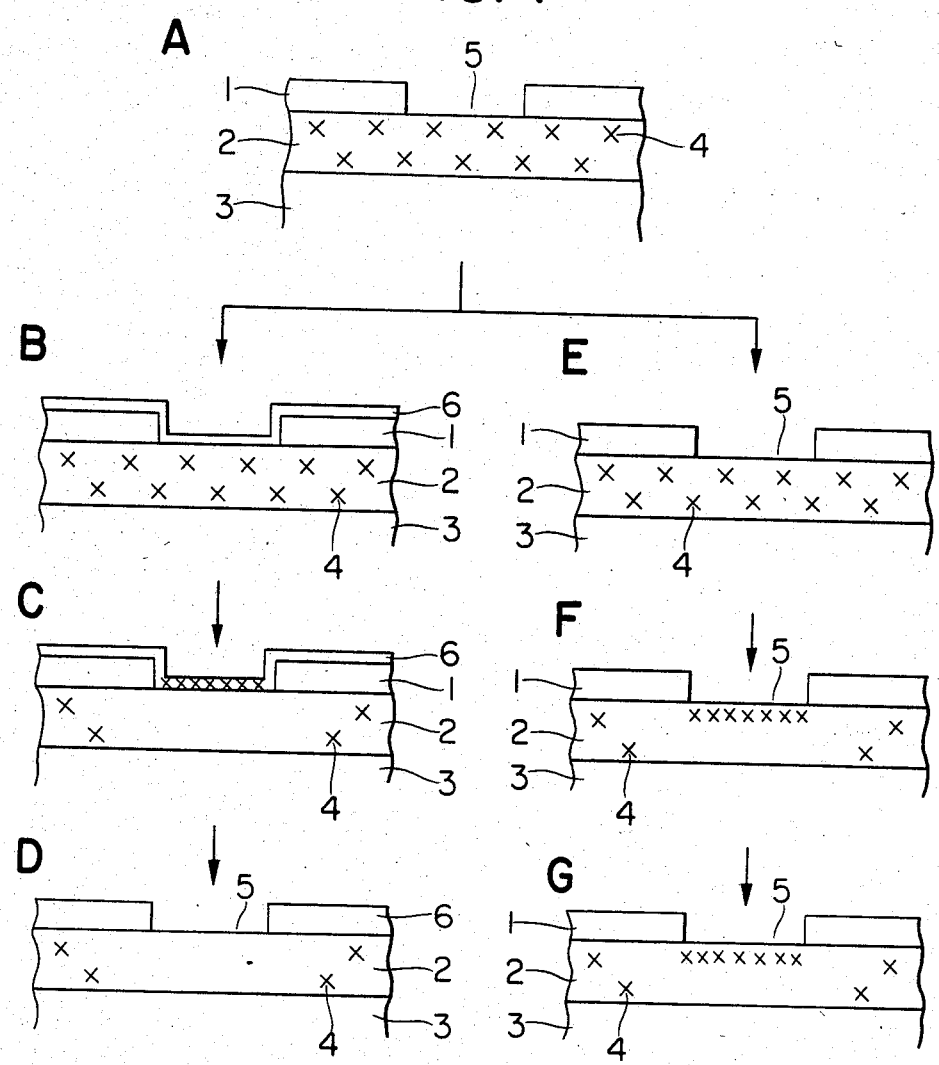
FIG. 1 illustrates the structure of a dry planographic plate.

DETAILED DESCRIPTION OF THE INVENTION:

The dry planographic plate as an object of the invention has an image area and a non-image area formed thereon by exposing an unprocessed dry planographic plate having any one of the following structures A to C through an image film and then developing the same: (A) a plate formed by providing an image forming substance layer (photosensitive layer) on a substrate and further providing a silicone rubber layer on the image forming substance layer as shown in the specifications of U.S. Pat. Nos. 3,894,873 and 4,358,522, for example (i.e., a plate having silicone rubber as the upper layer); (B) a plate formed by providing an image forming substance layer (photosensitive layer) on a silicone rubber layer backed with a substrate as shown in the specifications of U.S. Pat. Nos. 3,677,178, 3,949,142 and 3,909,265 (i.e., a plate having silicone rubber as the lower layer); and (C) a plate constituted by only a silicone rubber layer backed with substrate, the silicone rubber layer itself having photosentivity, as shown in the specifications of U.S. Pat. Nos. 3,953,212 and 3,865,588.

Examples of the substrate suitable for the dry planographic plate in accordance with the invention include a paper or plastic film or sheet, an elastic sheet such as rubber sheet, a metal sheet such as aluminum sheet, and these films or sheets subjected to various surface treatments, which have a thickness of about 10μ to 2 mm, preferably about 50 to 400μ. Also a cylindrical substrate may be employed.

The silicone rubber layer employed in the dry planographic plate in accordance with the invention has a thickness of about 0.5 to 100μ, preferably about 0.5 to 10μ, and has as its principal component a linear organic polysiloxane having a molecular weight of several thousands to several hundred thousands as well as the following repeating unit:

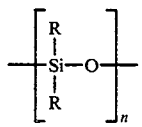

where n represents any integer between 20 and 20,000 and R represents an alkyl, alkenyl or phenyl group having 1 to 10 carbon atoms.

To this linear organic polysiloxane, a crosslinking agent is generally added. Examples of the crosslinking agent include acetoxy silane, ketoxime silane, alkoxy silane, amino silane and amido silane. They are generally combined with a linear organic polysiloxane having a hydroxyl group as a teminal group to form silicone rubbers.

In addition, these silicone rubbers may be silicone rubber layers having photosensitivity.

As a photosensitive substance added in order to provide a silicone rubber layer with photosensitivity or a photosensitive substance for forming a photosensitive layer, it is possible to employ such known photosensitive substances for a dry planographic plate as shown in the specifications of U.S. Pat. Nos. 3,894,873, 4,358,522, 3,677,178, 3,949,142, 3,909,265, 3,953,212 and 3,865,588.

The dry planographic plate in accordance with the invention is formed by applying a layer containing an organic polymer on the surface of a known dry planographic plate (having an image area and a non-image area formed thereon by development).

The thickness of the layer containing an organic polymer in accordance with the invention falls between 0.005 and 100μ, preferably 0.05 and 20μ, more preferably 0.1 and 5μ. An excessively small thickness makes it difficult to apply the layer uniformly, and impairs the ink receptivity of the image area. On the other hand, an excessively large thickness makes it difficult to effect coating, and undesirably allows the layer applied over the non-image area to receive ink in printing, causing "toning" unfavorably.

As the organic polymer employed in the invention, various kinds of known polymers and macromolecular substances are available, but the following organic polymers are particularly suitable on the grounds of the magnitude of effects offered thereby and the excellence in application thereof to the plate surface.

More specifically, such organic polymers are usable for the invention solely or in the form of a mixture as follows: aliphatic, aromatic and alicyclic hydrocarbon resins or modified resins thereof, alkyd resin, maleic resin, phenol resin, rosin, rosin ester, rosin-modified phenol resin, rosin-modified maleic resin, cumarone resin, terpene resin, cyclized rubber, ethylene-vinyl acetate copolymer, or petroleum resins, such as paraffin and microcrystalline wax.

In addition, as the organic polymers, the following synthetic rubbers are also usable solely or in the form of a mixture: polyisobutylene, chlorinated rubber, chlorinated butyl rubber, isoprene rubber, various SBRs, butyl rubber, nitrile rubber and butadiene rubber.

Moreover, as the organic polymer, it is also possible to employ a copolymer of N,N-dialkylacrylamide and other known vinyl monomer. The term "alkyl" used here means an alkyl group having 1 to 20 carbon atoms, which may have other functional group. Particularly, a copolymer of N,N-dialkylacrylamide and other monomer is hydrophilic and can form an aqueous solution or dispersion with water employed as a solvent; therefore, this copolymer is the most preferable.

The layer containing an organic polymer in accordance with the invention may also contain a surface-active agent, dye, binder, monomeric substance and so forth within such a range that the objective effect will not be impaired.

The reason that the printing plate coated with the layer containing an organic polymer in accordance with the invention is excellent in ink receptivity has not been well explicated so far. It is, however, conjectured that the layer containing an organic polymer absorbs a silicone substance in the image ara, and in printing, the organic polymer-containing layer having absorbed the silicone compound is immediately removed from the plate surface, so that the image area not contaminated with the silicone compound is exposed to obtain an excellent ink receptivity.

The above-mentioned effect is shown in FIG. 1 with a typical example. More specifically, at A in FIG. 1, a reference numeral 1 denotes a silicone rubber layer, while a numeral 2 represents a photosensitive layer. Moreover, numerals 3, 4 and 5 indicate a substrate, a silicone compound and an image area, respectively. The dry planographic plate immediately after development is supposed to be in the illustrated state (i.e., the silicone compound 4 oozing out from the silicone rubber layer 1 is dispersed in the photosensitive layer 2). If a layer 6 containing an organic polymer is applied to this dry planograhic plate, as shown by B, and the plate is stored for a long period of time, the silicone compound 4 is absorbed by the organic polymer-containing layer 6 as shown by C. If printing is effected under this state, the organic polymer-containing layer 6 is immediately removed from the plate surface by inking rollers. Therefore, as shown by D, the image area 5 not contaminated with the silicone compound is exposed, so that the ink receptivity in printing becomes excellent.

On the other hand, if the plate is stored for a long period of time without being subjected to any treatment as shown by E, the silicone compound 4 concentrates on the surface of the photosensitive layer 2 in the image area as shown by F, and the silicone compound 4 cannot be removed by printing as shown by G. Since the silicone compound 4, which repels ink, is concentratedly present in the image area 5 to which ink is to be attached, the ink receptivity in printing becomes poor.

Although FIG. 1 shows as a model a printing plate formed by providing a photosensitive layer on a substrate and further providing a silicone rubber layer on the photosensitive layer, it is considered that a similar phenomenon occurs in the case of a printing plate having other constructions.

To provide the organic polymer-containing layer in accordance with the invention, it is only necessary to coat the surface of a dry planograhic plate with a solution obtained by dissolving or dispersing the components constituting the organic polymer-containing layer in a proper solvent.

The method of coating is as follows: the plate surface may be coated with a solution obtained by dissolving or dispersing the components constituting the organic polymer-containing layer in a proper solvent by employing a continuous coater, such as bar coater, gravure roll coater, reverse roll coater and slit die coater; the plate may be dipped in the above solution; or the plate surface may be simply wiped with a waste soaked with the above solution. In addition, after being coated with the organic polymer-containing layer, the plate surface may be dried if necessary.

As a solvent, such solvents may be employed solely or in the form of a mixture as follows: esters, alcohols, ethers, ketones, hydrocarbons and water. A coating solution is employed in the form of a solution or dispersion obtained by dissolving or dispersing an organic polymer in one of these solvents. Furthermore, a coating solution may be developer which contains an organic polymer.

In the invention, it is essential to apply an organic polymer to the plate surface as described above. However, the method in which a film made of an organic polymer is laminated on the plate surface is not suitable for this invention, since it is difficult to completely cover the minute image area by this method. In other words, the coating in the invention does not include laminating and the like.

Figure 2:
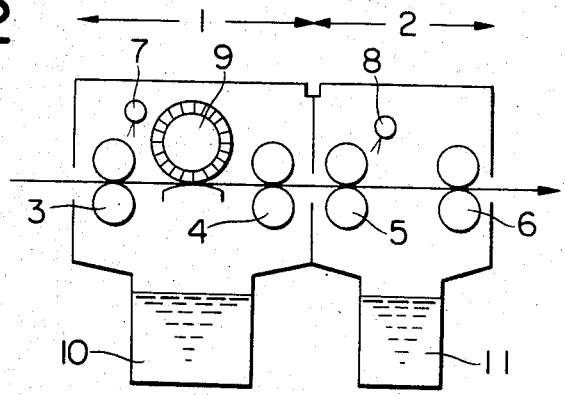
FIG. 2 illustrates an apparatus for processing a dry planographic plate.

Referring now to FIG. 2 which shows an example of a processing apparatus, a reference numeral 1 denotes a developing unit, while a numeral 2 represents a post-treating unit. Rolls for conveying a printing plate are shown by numerals 3, 4, 5, 6, respectively. A developer supply spray is indicated by a numeral 7, a post-treating solution supply spray by 8, a developing brush by 9, a developer tank by 10, and a post-treating solution tank by 11. The printing plate after exposure is advanced in the direction of the arrow while being processed. More specifically, the surface of the printing plate conveyed by the roll 3 is sprayed with a developer from the spray 7 and developed by the brush 9. The developed plate is conveyed by the rolls 4, 5, and the surface of the plate is coated with a post-treating solution containing an organic polymer supplied from the spray 8. Moreover, the roll 6 conveys the plate while squeezing the excessive post-treating solution, thereby to complete the processing. In this processing apparatus, a developing unit and a post-treating unit may be combined, depending on the type of a developer and a post-treating solution.

The invention is now explained through the following practical examples. However, it is to be noted that the invention is not limited by the examples at all.

EXAMPLE 1

A marketing unprocessed dry planographic plate (manufactured by Toray Industries, Inc.) constituted by a substrate having thereon a photosensitive layer overcoated with a silicone rubber layer was exposed and developed by an automatic developing machine for its exclusive use. The silicone amount at the image area surface of this printing plate immediately after the development and that of the plate after being stored under a room temperature for two months were measured by means of an ESCA (manufactured by Kokusai Electric Co., Ltd.). As a result, it has been found that when the printing plate is stored the silicon amount at the image area surface increases, as shown in Table 1 below.

TABLE 1

| Sample | Atom number ratio between Si and C |
| --- | --- |
| Immediately after development | 0.002 |
| Stored for two months | 0.074 |

When printing was effected by a press (Davidson Dualith 700) using these plates, the plate having been stored for two months showed an ink receptivity lower than that of the plate tested immediately after the development.

On the other hand, the above printing plate was coated immediately after development with a solution having the following composition:

| | | |
| --- | --- | --- |
| Solution composition | Tespol SPR-L(rosin-modified phenol resin; manufactured by Tokushima Seiyu) | 1 |
| | Isopar E (manufactured by Esso Chemical Ltd.) | 95 |
| | isopropyl alcohol | 5 |

Then, the silicon amount was similarly measured by employing the ESCA. The results are shown in Table 2 below.

TABLE 2

| Sample | Atom number ratio between Si and C |
| --- | --- |
| Immediately after development | 0.001 |
| Stored for two months and gently wiped with a waste soaked with Isopar E. | 0.002 |

When printing was effected using the above plates, there was not difference in ink receptivity therebetween, and both showed an excellent ink receptivity.

EXAMPLE 2

A marketing unprocessed dry planographic plate (manufactured by Toray Industries, Inc.) of the same type as that of the plate used in Example 1 was exposed and developed by the automatic developing machine for its exclusive use to obtain a dry planographic plate. Then, a solution obtained by dissolving 2 wt. % of No. 1 linseed oil in a mixed solution of Isopar E (manufactured by Esso Chemical Ltd.)/isopropyl alcohol (90/10) was prepared in a vat, and the above printing plate was dipped therein. Then, the printing plate was pulled up out of the solution, and the solution on the plate surface was squeezed by means of a hand rubber roller and air-dried.

The thus obtained printing plate was stored for two weeks in an 80% RH atmosphere at 40° C. When printing was effected using this plate, it showed an excellent ink receptivity.

On the other hand, the printing plate having been stored for two weeks under an 80% RH atmosphere at 40° C. without being subjected to any treatment after the development was lower in ink receptivity of the image area than the plate subjected to the above treatment.

EXAMPLE 3

A marketing unprocessed dry planographic plate (manufactured by Toray Industries, Inc.) of the same type as that of the plate used in Example 1 was processed by an ordinary method to obtain a dry planographic plate. Then, a solution obtained by dissolving 2 wt. % of polyvinyl pyrrolidone into a mixture solution of t-butanol/ethylcyclohexane (50/50) was made to well soak into waste and applied to the above printing plate, which was then air-dried.

The thus obtained printing plate was stored under 50° C. for five days. When printing was effected using this plate, it showed an excellent ink receptivity.

On the other hand, the printing plate having been stored under the same conditions without being subjected to any treatment after the development showed a lower ink receptivity than that of the plate which was subjected to the above treatment.

EXAMPLE 4

A marketing unprocessed dry planographic plate (manufactured by Toray Industries, Inc.) of the same type as that of the plate used in Example 1 was processed by an ordinary method to obtain a dry planographic plate. Then, the printing plate was dipped in a solution having the following composition:

| | | |
|---|---|---|
| Solution composition | N,N—dimethylacrylamide/2-ethylhexyl methacrylate (90/10) copolymer | 3 parts by weight |
| | water | 70 parts by weight |
| | Carbitol | 30 parts by weight |
| | surface-active agent | 0.5 part by weight |

The thus obtained printing plate was stored under 50° C. for five days. When printing was effected using this plate, it showed an excellent ink receptivity.

What is claimed is:

1. In a dry planographic plate, having a substrate and a photosensitive layer thereon, said plate having a printing surface with an image area for receiving ink for printing of the image and a non-image area for repelling ink to not print in the non-image area, said non-image area comprising a silicone rubber layer, the improvement comprising that the printing surface of said plate has a coating thereover of a thin film having a thickness of 0.005 to 100μ and consisting substantially of at least one organic polymer selected from the group consisting of aliphatic hydrocarbon resin, aromatic hydrocarbon resin, alicylic hydrocarbon resin, alkyd resin, maleic resin, phenol resin, rosin, rosin ester, rosin-modified phenol resin, rosin-modified maleic resin, cumarone resin, terpene resin, cyclized rubber, ethylene-vinyl acetate copolymer, paraffin wax, microcrystalline wax, polyisobutylene rubber, chlorinated rubber, chlorinated butyl rubber, isoprene rubber, SBRs, butyl rubber, nitrile rubber, butadiene rubber, and copolymer of N,N-dialkylacrylamide, and other vinyl monomers.

2. A dry planographic plate according to claim 1, said plate comprising a photosensitive layer on the substrate and a silicone rubber layer on the photosensitive layer.

3. A dry planographic plate according to claim 1, said plate comprising a silicone rubber layer on the substrate and a photosensitive layer on the silicone rubber layer.

4. A dry planographic plate according to claim 1, said plate comprising a silicon rubber layer on a substrate, said silicone rubber layer being a photosensitive silicone.

5. A dry planographic plate according to claim 1, said organic polymer is at least one petroleum resin selected from the group consisting of paraffin wax and microcrystalline wax.

6. A dry planographic plate according to claim 1, said organic polymer is at least one synthetic rubber selected from the group consisting of polyisobutylene rubber, chlorinated rubber, chlorinated butyl rubber, isoprene rubber, SRBs, butyl rubber, nitrile rubber and butadiene rubber.

7. A dry planographic plate according to claim 1, wherein said organic polymer is a polymer of N,N-dialkylacrylamide, or a copolymer having the same as its principal component.

* * * * *